United States Patent
Ryu

(10) Patent No.: US 8,582,392 B2
(45) Date of Patent: Nov. 12, 2013

(54) NON-VOLATILE MEMORY DEVICES FOR OUTPUTTING DATA USING DOUBLE DATA RATE (DDR) OPERATIONS AND METHODS OF OPERATING THE SAME

(75) Inventor: Dong-ryul Ryu, Gyeonggi-do (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/286,967

(22) Filed: Nov. 1, 2011

(65) Prior Publication Data
US 2012/0047389 A1  Feb. 23, 2012

Related U.S. Application Data

(63) Continuation of application No. 10/997,199, filed on Nov. 24, 2004, now Pat. No. 8,145,867.

(30) Foreign Application Priority Data

Jul. 27, 2004 (KR) .................................. 2004-58798

(51) Int. Cl.
G11C 8/16 (2006.01)
(52) U.S. Cl.
USPC .................. 365/233.13; 365/193; 365/233.1; 365/233.17; 365/233.18
(58) Field of Classification Search
USPC .................. 365/189.011, 185.15, 193, 233.1, 365/233.13, 233.17, 233.18
See application file for complete search history.

(56) References Cited

U.S. PATENT DOCUMENTS

| | | | |
|---|---|---|---|
| 5,610,874 A | 3/1997 | Park et al. | |
| 5,793,693 A | 8/1998 | Collins et al. | |
| 5,805,523 A | 9/1998 | Lysinger | |
| 5,966,420 A | 10/1999 | Lee | |
| 6,502,173 B1 * | 12/2002 | Aleksic et al. | 711/168 |
| 6,570,791 B2 | 5/2003 | Roohparvar et al. | |
| 6,603,686 B2 * | 8/2003 | Yoo et al. | 365/193 |
| 6,654,307 B2 | 11/2003 | Widmer et al. | |
| 6,681,301 B1 * | 1/2004 | Mehta et al. | 711/154 |
| 6,795,906 B2 * | 9/2004 | Matsuda | 711/167 |
| 6,996,016 B2 * | 2/2006 | Oh | 365/193 |
| 7,173,866 B2 * | 2/2007 | Na et al. | 365/193 |
| 2004/0001366 A1 | 1/2004 | Perroni et al. | |

FOREIGN PATENT DOCUMENTS

JP   2003-059275   2/2003
JP   20004-164769  6/2004

OTHER PUBLICATIONS

First Office Action corresponding to Japanese Patent Application No. 2005-213258 dated Jan. 11, 2011; 2 pages.

* cited by examiner

*Primary Examiner* — Vanthu Nguyen
(74) *Attorney, Agent, or Firm* — Muir Patent Consulting, PLLC

(57) ABSTRACT

A non-volatile memory device is operated by outputting data in response to an alternating sequence of first and second edges of a read control signal, respectively. A determination is made whether the read control signal and a write control signal are in synchronization at one of the first edges. Output of the data is stopped at the second edge that follows the one of the first edges of the read control signal if the read control signal and the write control signal are in synchronization at the one of the first edges.

28 Claims, 12 Drawing Sheets

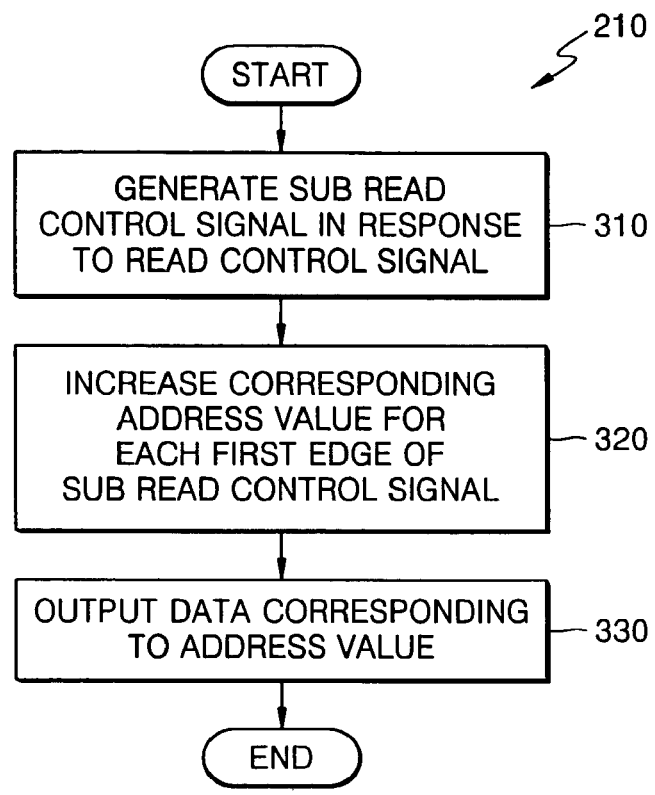

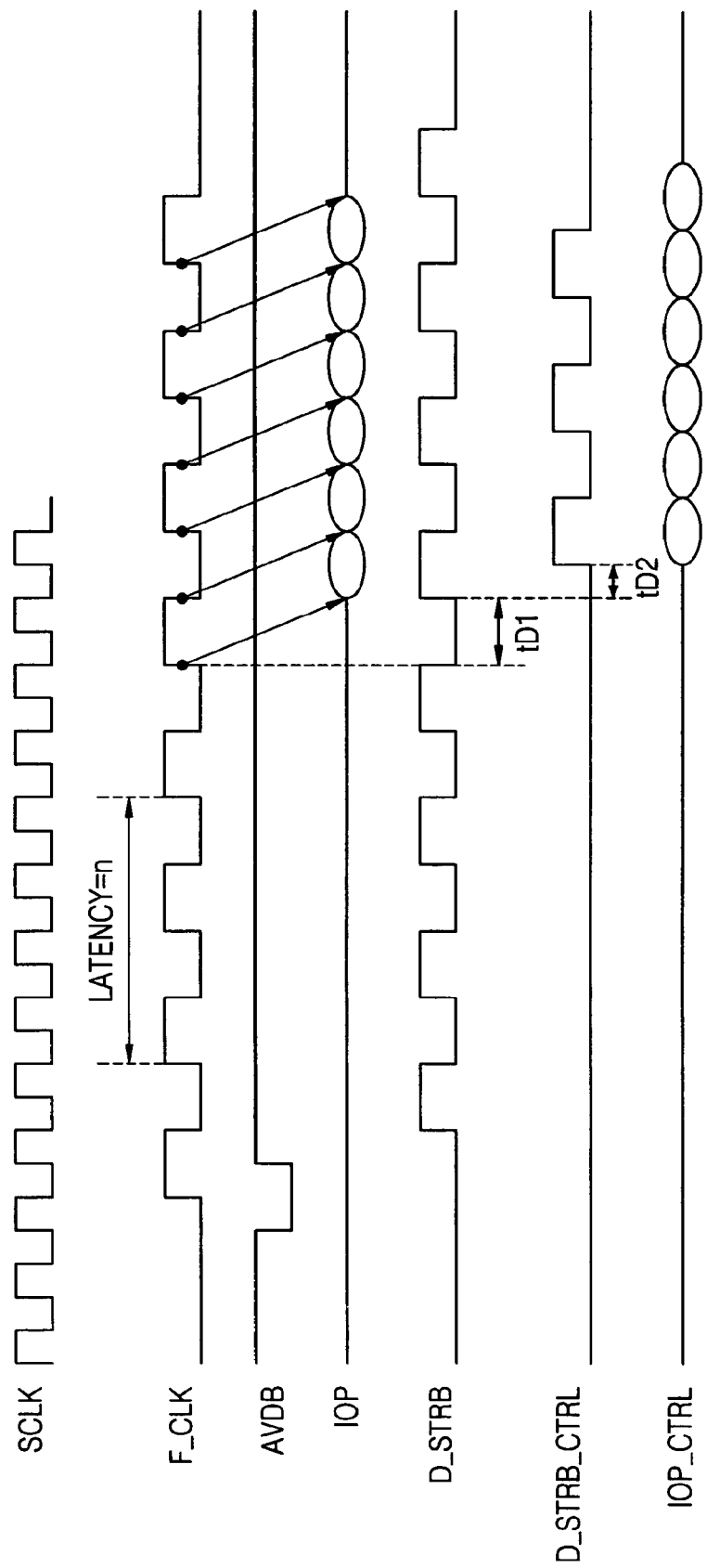

NON-VOLATILE MEMORY DEVICES FOR OUTPUTTING DATA USING DOUBLE DATA RATE (DDR) OPERATIONS AND METHODS OF OPERATING THE SAME

RELATED APPLICATION

This application is a Continuation Application of U.S. patent application Ser. No. 10/997,199 filed on Nov. 24, 2004, now U.S. Pat. No. 8,145,867 which claims the benefit of and priority to Korean Patent Application No. 2004-58798 filed Jul. 27, 2004, the disclosure of each of which is hereby incorporated herein by reference.

FIELD OF THE INVENTION

The present invention relates generally to integrated circuit devices and methods of operating the same and, more particularly, to double data rate (DDR) integrated circuit memory devices and methods of operating the same.

BACKGROUND OF THE INVENTION

A non-volatile memory device may receive or output data through an input/output pin in synchronization with rising edges and/or falling edges of a read control signal and/or write control signal when reading or writing data. FIG. 1a is a timing diagram showing an ideal data output of a conventional non-volatile memory device. SCLK represents a system clock and REB is a read control signal for controlling the output of data. The non-volatile memory device outputs data through an input/output pin IOP in response to falling edges of the read control signal REB.

It will be understood by those of ordinary skill in the art that the recitation "in response to" is not limited to cases in which the read control signal REB is directly applied to the non-volatile memory device, and includes cases in which the read control signal REB is input to the non-volatile memory device via different components or cases in which the read control signal REB generates a different signal to allow the non-volatile memory device to perform a data read operation.

A controller (not shown) for controlling the non-volatile memory device applies a read control signal REB to the non-volatile memory device to receive data during a read operation. Generally, the non-volatile memory device outputs data through an input/output pin for each period of the read control signal REB. If the data read operation is terminated, the read control signal REB is fixed to a logic high level or logic low level and the input/output pin is maintained in a high-impedance state.

Referring now to FIG. 1A, a read operation is performed in response to falling edges of a read control signal REB and the read data is output through an input/output pin (IOP) to an external source in synchronization with rising edges of the read control signal REB. In an ideal case with no signal delays due to various causes, as shown in FIG. 1a, data is read at the falling edges of the read control signal REB and output at the rising edges of the read control signal REB through the input/output pin IOP.

FIG. 1B is a timing diagram showing an actual data output of a conventional non-volatile memory device. Referring now to FIG. 1B, the data read in response to the falling edges of the read control signal REB is delayed by a predetermined time from the falling edges of the read control signal REB and then output to the input/output pin IOP. tOH represents a time consumed from a rising edge of the read control signal REB to a time when the input/output pin IOP changes to the high-impedance state.

As shown in FIG. 1B, data that are output in response to the read control signal REB has a non-negligible time delay. Also, because data are output in response to rising edges or falling edges of the read control signal REB, the speed of a read operation may be limited.

SUMMARY OF THE INVENTION

According to some embodiments of the present invention, a non-volatile memory device is operated by outputting data in response to an alternating sequence of first and second edges of a read control signal, respectively. A determination is made whether the read control signal and a write control signal are in synchronization at one of the first edges. Output of the data is stopped at the second edge that follows the one of the first edges of the read control signal if the read control signal and the write control signal are in synchronization at the one of the first edges.

In other embodiments of the present invention, outputting of the data comprises generating a sub read control signal with a frequency double that of the read control signal in response to the read control signal. A corresponding address value is increased for each first edge of the sub read control signal. And data are output corresponding to the increased address value.

In still other embodiments of the present invention, a data strobe signal is generated by delaying the read control signal by a predetermined delay time. The data strobe signal is output with the data concurrently to an external source.

In still other embodiments of the present invention, the predetermined delay time is a time period from a time when the read control signal is input to the non-volatile memory device to a time when the data is output from the non-volatile memory device.

In further embodiments of the present invention, a non-volatile memory device is operated by counting first edges of a flash clock signal that comprises an alternating sequence of first and second edges responsive to a read recognition signal. Data are output responsive to the first and second edges of the flash clock signal from a time beginning at the (n+1)-th first edge of the flash clock signal if a count of the first edges of the flash clock signal reaches n. Output of the data is stopped if a number of the output data reaches m (m is a natural number).

In still further embodiments of the present invention, the read recognition signal is received from an external controller of the non-volatile memory device.

In still further embodiments of the present invention, outputting of the data comprises generating a sub flash clock signal with a frequency double that of the flash clock signal if the count of the first edges of the flash clock signal reaches n. A corresponding address value is increased for each first edge of the sub flash clock signal. Data corresponding to the increased address value are output.

In still further embodiments of the present invention, a data strobe signal is generated by delaying the read control signal by a predetermined delay time. The data strobe signal is output with the data concurrently to an external source.

In still further embodiments of the present invention, the predetermined delay time is a time period from a time when the flash clock signal is input to the non-volatile memory device to a time when the data is output from the non-volatile memory device.

Although described above primarily with respect to method embodiments of operating a non-volatile memory device, it will be understood that the present invention is not limited to such embodiments, but may also be embodied as non-volatile memory devices.

BRIEF DESCRIPTION OF THE DRAWINGS

Other features of the present invention will be more readily understood from the following detailed description of specific embodiments thereof when read in conjunction with the accompanying drawings, in which:

FIGS. 2 and 3 are flowcharts that illustrate data output methods according to some embodiments of the present invention;

FIG. 12 is a timing diagram that illustrates operations of the controller according to some embodiments of the present invention.

DETAILED DESCRIPTION OF PREFERRED EMBODIMENTS

Figure 1A:
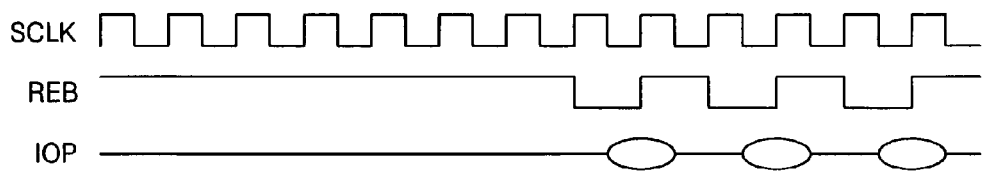
FIG. 1A is a timing diagram that illustrates ideal data output in a conventional non-volatile memory device.
Figure 1B:
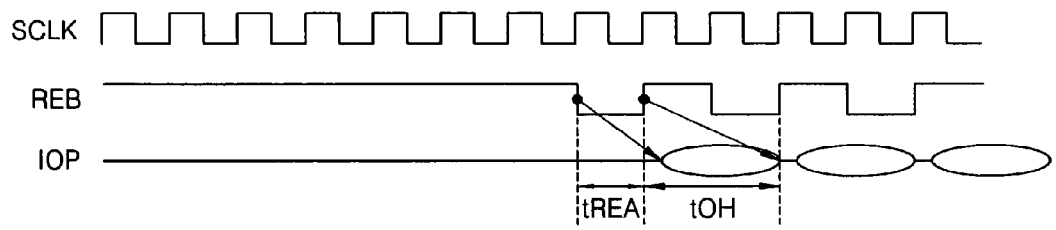
FIG. 1B, is a timing diagram that illustrates actual data output in a conventional non-volatile memory device.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention are described herein in the context of a NAND flash memory. It will be understood, however, that the present invention can be embodied in various non-volatile memory devices including, but not limited to, a NOR device, an AND device, a DINOR (Divided bit-line NOR) device, a OneNAND device, and a FRAM (Ferroelectric RAM).

Figure 2:
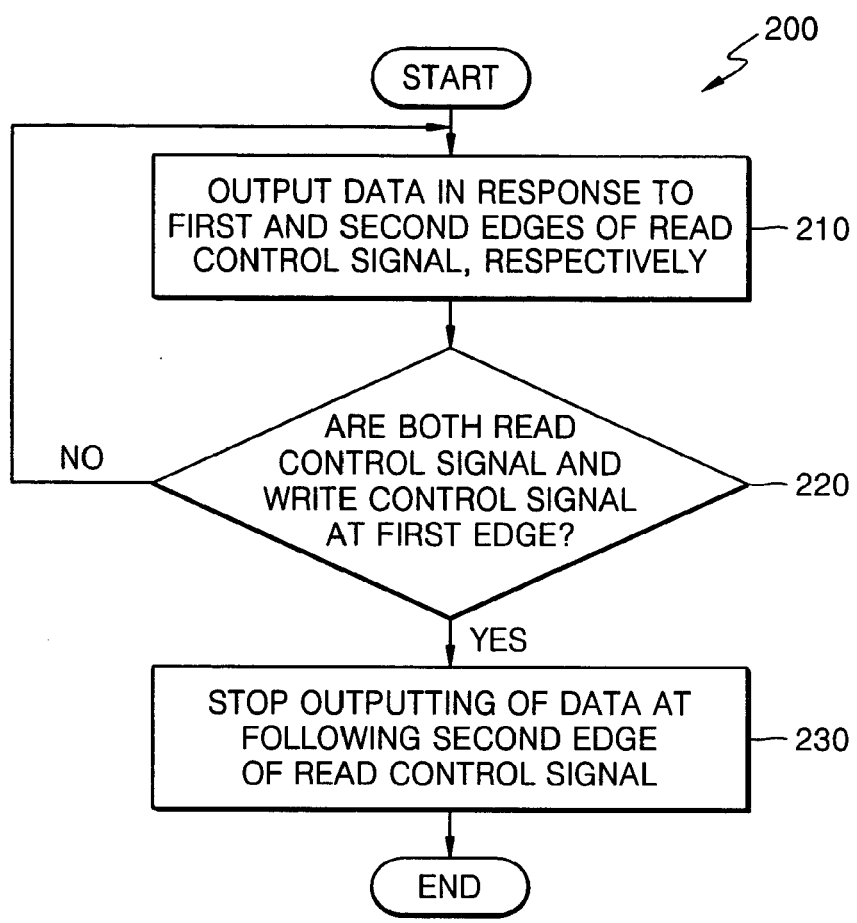

FIGS. 2 and 3 are flowcharts that illustrate data output methods according to sonic embodiments of the present invention. Referring now to FIG. 2, methods 200 for outputting data stored in a non-volatile memory device, according to some embodiments of the present invention begin by outputting the data in response to first edges and second edges of a read control signal for controlling an output of the data, respectively (block 210). A determination is made whether the read control signal and a write control signal for controlling a write of the data are at the first edge at the same time (block 220). If the read control signal and the write control signal are at the first edge at the same time, then the output of the data is stopped at a following second edge of the read control signal (block 230).

Figure 4A:
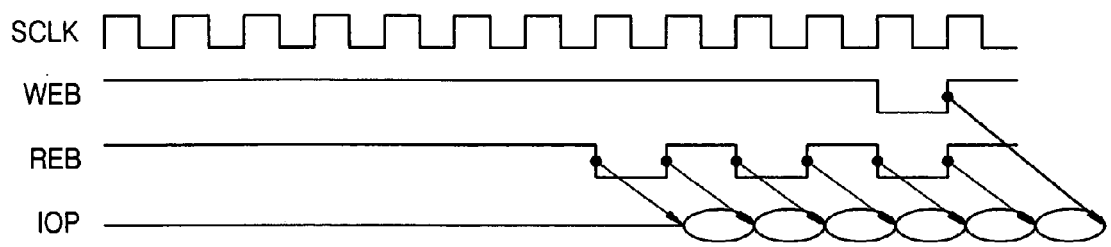
FIG. 4A is a timing diagram showing data output according to the data output method embodiments of FIGS. 2 and 3.
Figure 4B:
FIG. 4B illustrates a waveform of the read control signal and a waveform of a sub read control signal according to some embodiments of the present invention.

FIG. 4A is a timing diagram showing data output according to the data output method embodiments of FIGS. 2 and 3. FIG. 4B illustrates a waveform of the read control signal and a waveform of a sub read control signal. According to the data output method embodiments of FIGS. 2 and 3, two datums can be output through an input/output pin during a period of the read control signal. That is, data is output in response to the first and second edges of the read control signal (block 210).

For convenience, it is assumed that the first edge is a rising edge and the second edge is a falling edge. The assumption for the first and second edges can be changed, however.

The write control signal is used for indicating that a data read operation is terminated. In a conventional technique, the read control signal is fixed to a high level or a low level to indicate that the data read operation is terminated. Because data is output at all the rising and falling edges of the read control signal, according to some embodiments of the present invention, indicating the termination of the data read operation using the read control signal may not be possible. For this reason, the write control signal is used. If both a write control signal and a read control signal are at the first edge at the same time, that is, at a rising edge (block 220), the output of data is stopped (step 230). This state is shown in FIG. 4a.

Figure 5:
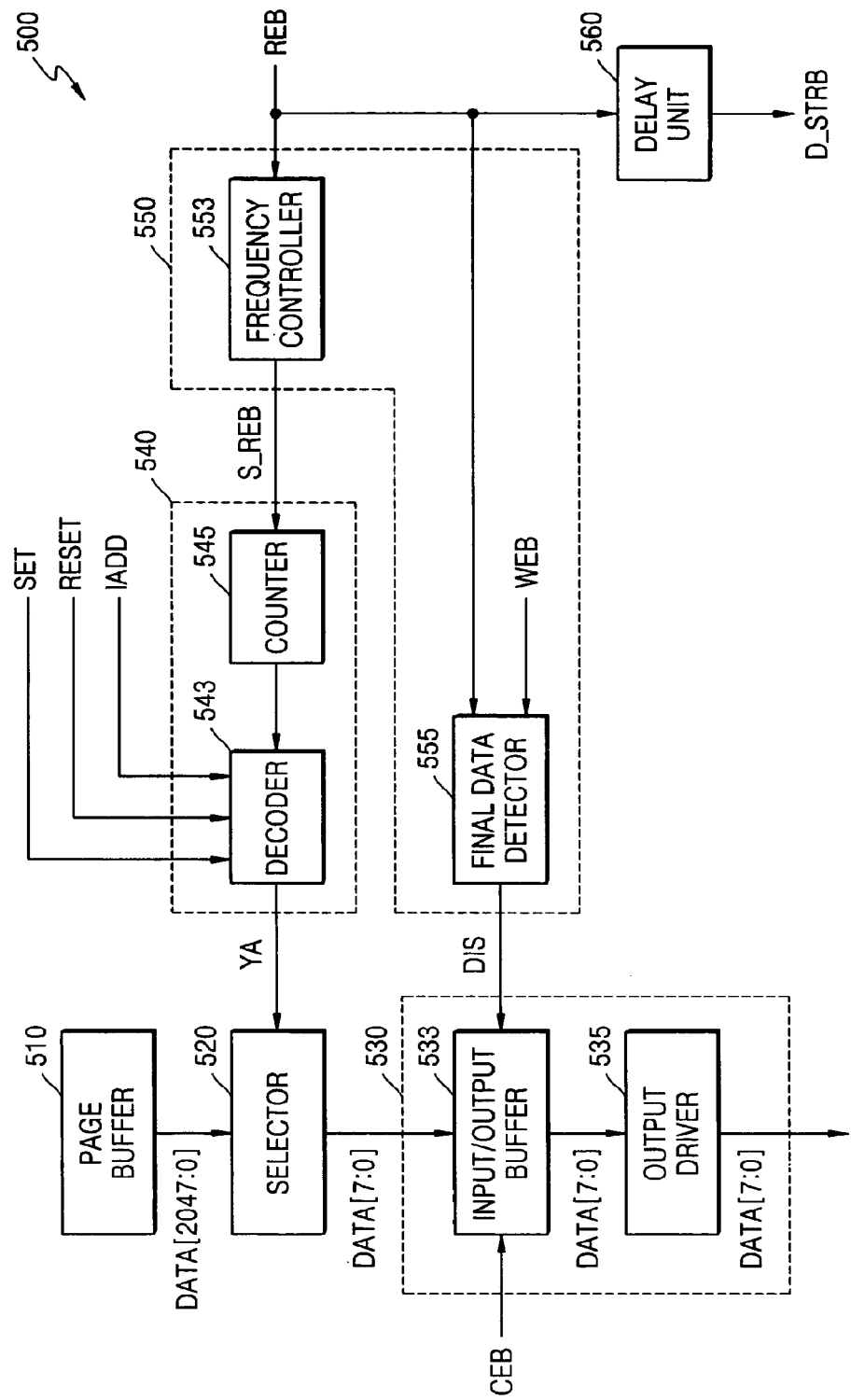
FIG. 5 is a block diagram of a non-volatile memory device according to some embodiments of the present invention.
Figure 6:
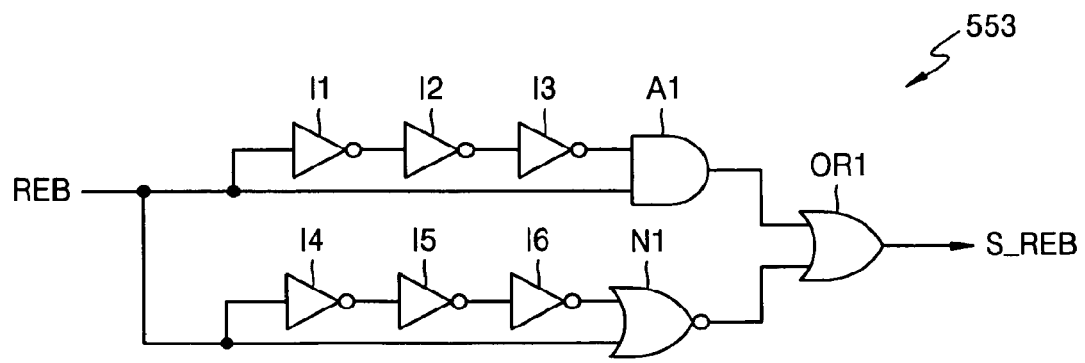
FIG. 6 is a circuit diagram of a frequency controller shown in FIG. 5 according to some embodiments of the present invention.

FIG. 5 is a block diagram of a non-volatile memory device according to some embodiments of the present invention. FIG. 6 is a circuit diagram of a frequency controller shown in FIG. 5.

Referring now to FIG. 5, a non-volatile memory device 500 comprises a page buffer 510, a selector 520, an output unit 530, an address signal generator 540, and a data read controller 550. The page buffer 510 stores a portion of data stored in a non-volatile memory array (not shown). The selector 520 outputs data corresponding to an address value of an address signal YA among data DATA [2047:0] stored in the page buffer 510.

The output unit 530 is activated in response to an enable signal CEB, outputs data DATA[7:0] received from the selector 520 through an input/output pin, and is deactivated in response to a disable signal DIS.

The address signal generator 540 decodes an initial address IADD, generates an address signal YA, and changes the address value of the address signal YA in response to a sub read control signal S_REB.

The data read controller 550 generates a sub read control signal S_REB with a frequency double of that of the read control signal REB in response to the read control signal REB and generates a disable signal DIS in response to a write control signal WEB.

Data output methods and operations of the non-volatile memory device, according to some embodiments of the present invention, will be described in detail with reference to FIGS. 2 through 6. The page buffer 510 of the non-volatile memory device 500 receives and stores data from a non-volatile memory array (not shown). The page buffer 510 may be a register in accordance with some embodiments of the present invention. The size of the page buffer 510 may be 512 bytes, 1 KBytes, 2 KBytes, or larger.

In FIG. 5, it is assumed that the size of the page buffer 510 is 2 KBytes. Because a conventional non-volatile memory device outputs data for each byte, 2000 periods of a read control signal REB would be consumed to output all data stored in the page buffer 510. In the non-volatile memory device 500 according to some embodiments of the present invention, only 1000 periods of the read control signal REB may be consumed.

The data is output in response to the first and second edges of the read control signal REB for controlling the output of the data, respectively (block 210). At block 210, a sub read control signal S_REB with a frequency double that of the read control signal REB is generated in response to the read control signal REB (block 310).

The operations of block 310 may be performed by the data read controller 550. The data read controller 550 includes a frequency controller 553 and a final data detector 555. The frequency controller 553 doubles the frequency of the read control signal REB and generates the sub read control signal S_REB.

That is, the frequency controller 553 acts as a frequency doubler, which increases the frequency of an input signal to a desired ratio. An example of the frequency controller 553, according to some embodiments of the present invention, is shown in FIG. 6. It will be understood that the frequency controller 553 can be implemented in various ways and is not limited to the structure of FIG. 6.

The frequency controller 553 detects rising and falling edges of the read control signal REB and generates the sub read control signal S_REB. A waveform of the sub read control signal S_REB is shown in FIG. 4b. Because the frequency of the read control signal REB is doubled, a period of the sub read control signal S_REB corresponds to half that of the read control signal REB.

The frequency controller 553 includes inverters I1 through I6, an AND device A1, a NOR device N1, and an OR device OR1. The number of inverters I1 through I6, which is an odd number, may be a predetermined number to create a desired pulse width. Operations of the frequency controller 553 for increasing the frequency are generally known by those of ordinary skill in the art and, therefore, detailed descriptions thereof are omitted.

Returning to FIG. 3, a corresponding address value is increased for every first edge of the sub read control signal S_REB (block 320). The operations of block 320 may be performed by the address signal generator 540.

The address signal generator 540 increases the address value of the address signal YA sequentially whenever the first edges of the sub read control signal S_REB are detected. The address signal generator 540 includes a decoder 543 and a counter 545.

The decoder 543 decodes an initial address IADD and generates an address signal YA. The initial address IADD is an address of data to be first selected and output among data stored in the page buffer 510. The initial address IADD can be set by a designer through an external source. The decoder 453 is set or reset by a set signal SET or a reset signal RESET.

The counter 545 counts the first edges of the sub read control signal S_REB and increases the address value of the address signal YA sequentially. As illustrated in FIG. 4b, counting the first edges of the sub read control signal S_REB is the same as counting the rising edges and falling edges of the read control signal REB.

That is, increasing the address value of the address signal YA for every first edge of the sub read control signal S_REB using the decoder 543 is the same as increasing the address value of the address signal YA for every rising edge and every falling edge of the read control signal REB. If the address value of the address signal YA increases, data corresponding to the increased address value is output (block 330).

The address signal YA is used as a control signal of the selector 520 for selecting eight data DATA[7:0] among the data output from the page buffer 510. The data DATA[7:0] output from the selector 520 is transferred to an external source through the output unit 530.

The output unit 530, which is activated in response to an enable signal CEB, outputs the data DATAP[7:0] from the selector 520 through the input/output pin, and is deactivated in response to a disable signal DIS.

The output unit 530 includes an input/output buffer 533 and an output driver 535. The input/output buffer 533 outputs or blocks the data DATA[7:0] in response to the enable signal CEB or the disable signal DIS. The output driver 535 outputs the data DATA[7:0] from the input/output buffer 533 to the external source through the input/output pin.

The enable signal CEB, which is a signal for activating the input/output buffer 533, allows the input/output buffer 533 to output the data DATA[7:0]. The disable signal DIS is output from a final data detector 555 of the data read controller 550. The final data detector 555 determines whether both the write control signal WEB and the read control signal REB are at the first edge at the same time (block 220), and generates a disable signal DIS if the write control signal WEB and the read control signal REB are at the first edge at the same time. The disable signal DIS stops the operation of the input/output buffer 553 and also blocks the output of the data DATA[7:0] (block 230)

In a conventional non-volatile memory device, when the read control signal REB is fixed to a logic high level or logic low level, the input/output pin IOP is typically driven to a high-impedance state and data is no longer output. According to some embodiments of the present invention, however, it is not possible to determine using the read control signal REB the time when the output of the data DATA[7:0] is stopped. The time when the output of data is stopped is determined using the write control signal WEB.

If both the read control signal REB and the write control signal WEB are at the first edge and are applied to the final data detector 555, then the final data detector 555 outputs a disable signal DIS. The structure of the final data detector 555 for determining whether or not both the signals are at the first edge at the same time is generally known to those of ordinary skill in the art; therefore, detailed descriptions thereof are omitted. Also, it is possible to generate the disable signal DIS when both of the signals are at the second edge at the same time.

According to further embodiments of the data output method 200, a data strobe signal D_STRB may created by delaying the read control signal REB by a predetermined delay time and output at the same time with the data DATA [7:0] to the external source. Generation of the data strobe signal D_STRB is performed by the delay unit 560 of the non-volatile memory device 500. The data DATA[7:0] output from the non-volatile memory device 500 is applied to an external controller (not shown). When the data DATA[7:0] is transferred from the non-volatile memory device 500 to the external controller (not shown), a time difference exists due to the flight time and the clock skew.

Also, as the operation speed of the non-volatile memory device 500 increases, deciding a time when the controller fetches the data DATA[7:0] output from the non-volatile memory device 500 may become more difficult. To solve such a problem, the non-volatile memory device 500 outputs a data strobe signal D_STRB for indicating the time when the controller fetches the data DATA[7:0] at the same time with the data DATA[7:0].

Figure 7:
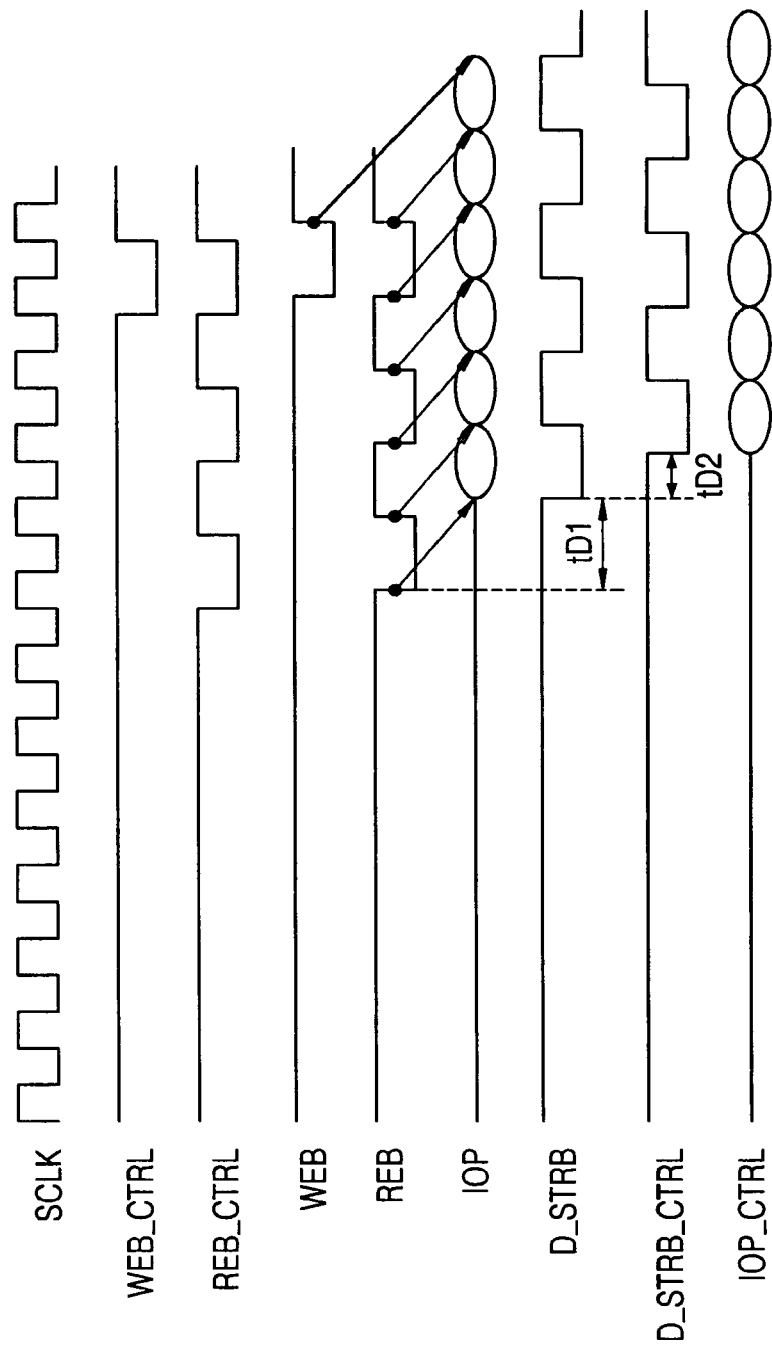
FIG. 7 is a timing diagram that illustrates exemplary operations of the controller responsive to the data strobe signal according to some embodiments of the present invention.

FIG. 7 is a timing diagram that illustrates exemplary operations of the controller responsive to the data strobe signal D_STRB according to some embodiments of the present invention. WEB_CTRL is a write control signal generated from the controller (not shown) and is applied to the non-volatile memory device 500. REB_CTRL is a read control signal generated from the controller (not shown) and is applied to the non-volatile memory device 500.

The data DATA[7:0] is output through the input/output pin IOP in response to the rising and falling edges of the read control signal REB and simultaneously the data strobe signal D_STRB is output. The data strobe signal D_STRB is a signal that is created by delaying the read control signal REB by a predetermined delay time tD1. Here, the delay time tD1 is a time period from a time when the read control signal REB is input to the non-volatile memory device 500 to a time when the data DATA[7:0] is output from the non-volatile memory device 500.

The delay unit 560 may be designed to have a constant delay time tD1 regardless of PVT (Process, Voltage, and Temperature) variation. The delay unit 560 can be designed such that its delay time tD1 is adjusted using resistors or capacitors. Also, the delay unit 560 can be designed such that its delay time tD1 is adjusted in a digital format using internal registers in accordance with various embodiments of the present invention.

D_STRB_CTRL represents the data strobe signal D_STRB transmitted from the non-volatile memory device 500 to the controller (not shown). tD2 represents a propagation delay time from the non-volatile memory device 500 to the controller (not shown). An input/output pin IOP_CTRL of the controller fetches data in response to the data strobe signal D_STRB_CTRL.

In the data output method 200 and non-volatile memory device 500 according to some embodiments of the present invention, because data is output in response to all of the rising and falling edges of the read control signal REB, it may be possible to increase the amount of data transmission per a unit time and synchronize data output by the data strobe signal D_STRB with the controller.

Figure 8:
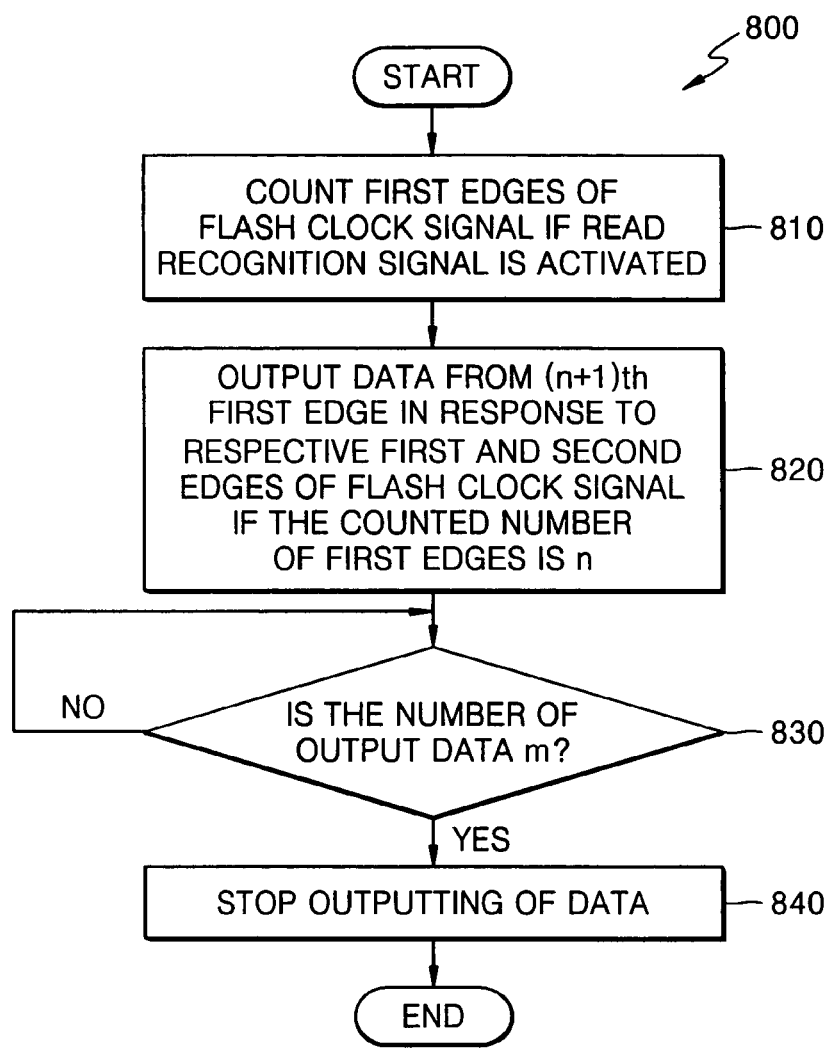
FIGS. 8 and 9 are flowcharts that illustrate data output methods according to further embodiments of the present invention.
Figure 9:
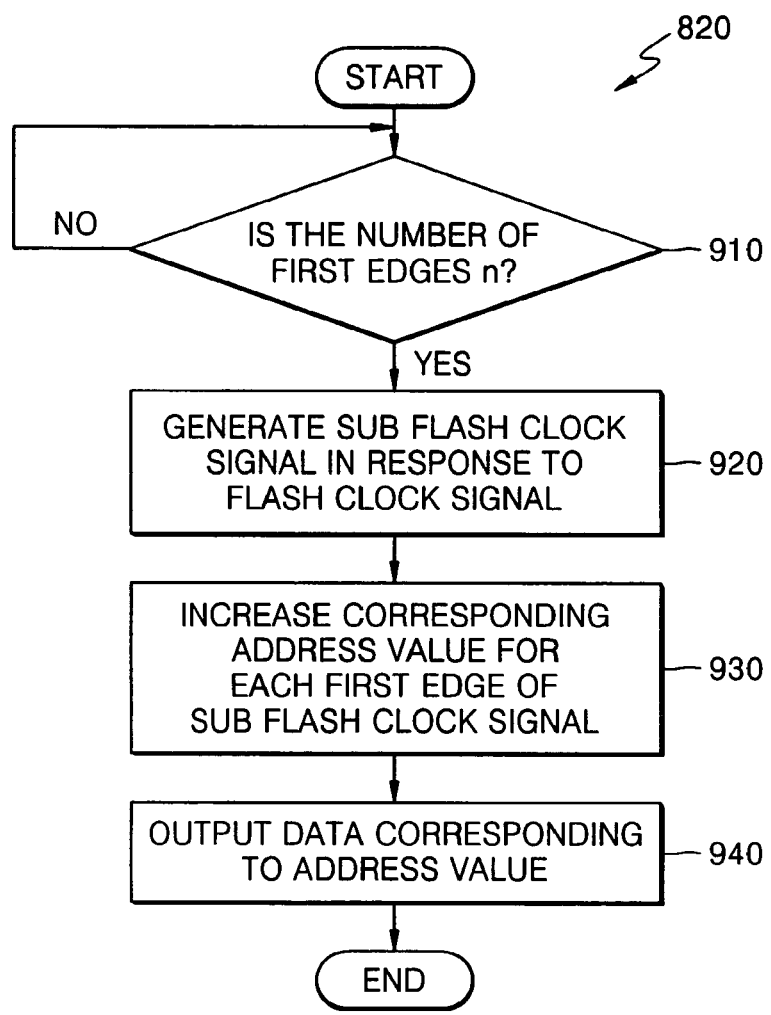

FIGS. 8 and 9 are flowcharts that illustrate data output methods according to further embodiments of the present invention. Referring now to FIG. 8, methods 800 for outputting data stored in a non-volatile memory device, according to some embodiments of the present invention begin by counting the number of first edges of a flash clock signal if a read recognition signal is activated (block 810). If the number of the first edges of the flash clock signal is n (n is a natural number), the data from a (n+1)-th first edge is output in response to first edges and second edges of the flash clock signal, respectively (block 820). If the number of output data is m (m is a natural number), then output of the data is stopped (blocks 830 and 840).

Figure 10A:
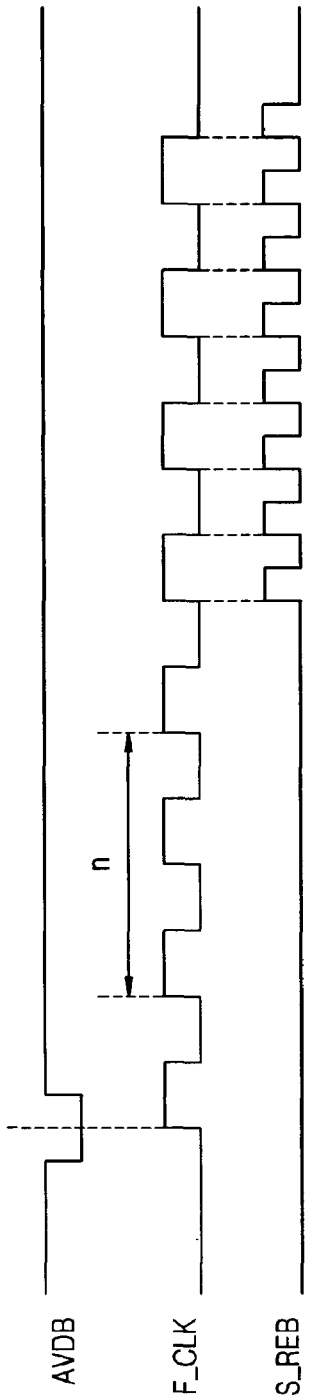
FIG. 10A is a timing diagram that illustrates data output according to the data output method embodiments of FIGS. 8 and 9.
Figure 10B:
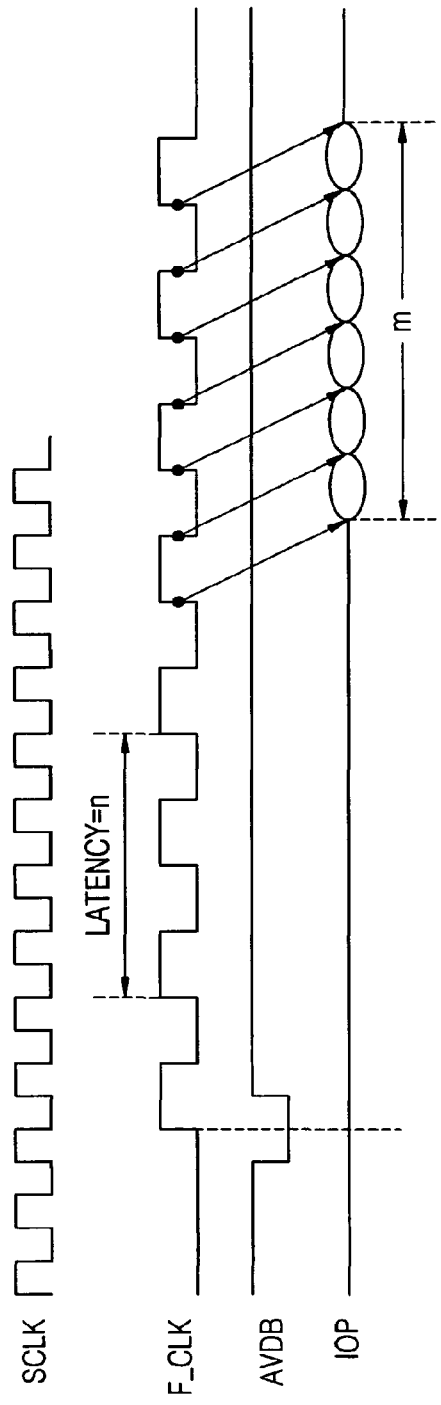
FIG. 10B shows a waveform of a flash clock signal and a waveform of a sub flash clock signal according to some embodiments of the present invention.

FIG. 10A is a timing diagram showing data output according to the data output method embodiments of FIGS. 8 and 9. FIG. 10B shows a waveform of a flash clock signal and a waveform of a sub flash clock signal. According to the data output method 800 embodiments, a read recognition signal is activated in advance to output data. The read recognition signal, as a signal received from an external controller of the non-volatile memory device, is a signal for indicating the beginning of a data read operation. A signal for controlling a read of data is the flash clock signal. Data may be output through an input/output pin in response to both the rising and falling edges of a flash clock signal, as in the data output method 200 embodiments of FIG. 2.

Referring now to FIG. 9, block 820 for outputting data, in accordance with some embodiments of the present invention, comprises counting the number n of the first edges of the flash clock signal (block 910). If the number n of the first edges of the flash clock signal is n, then a sub flash clock signal with a frequency double that of the flash clock signal is generated in response to the flash clock signal (block 920). A corresponding address value is increased for each first edge of the sub flash clock signal (block 930). Data corresponding to the increased address value it output (block 940).

For convenience, it is assumed that the first edge is a rising edge and the second edge is a falling edge. The assumption for the first and second edges can be changed, however.

According to the data output method embodiments 800, to that the data read operation is terminated, a write control signal as in the data output method embodiments 200 of FIG. 2 is not used. Instead, the number of output data is counted and the output of the data is stopped when the number of output data reaches a predetermined number.

Figure 11:
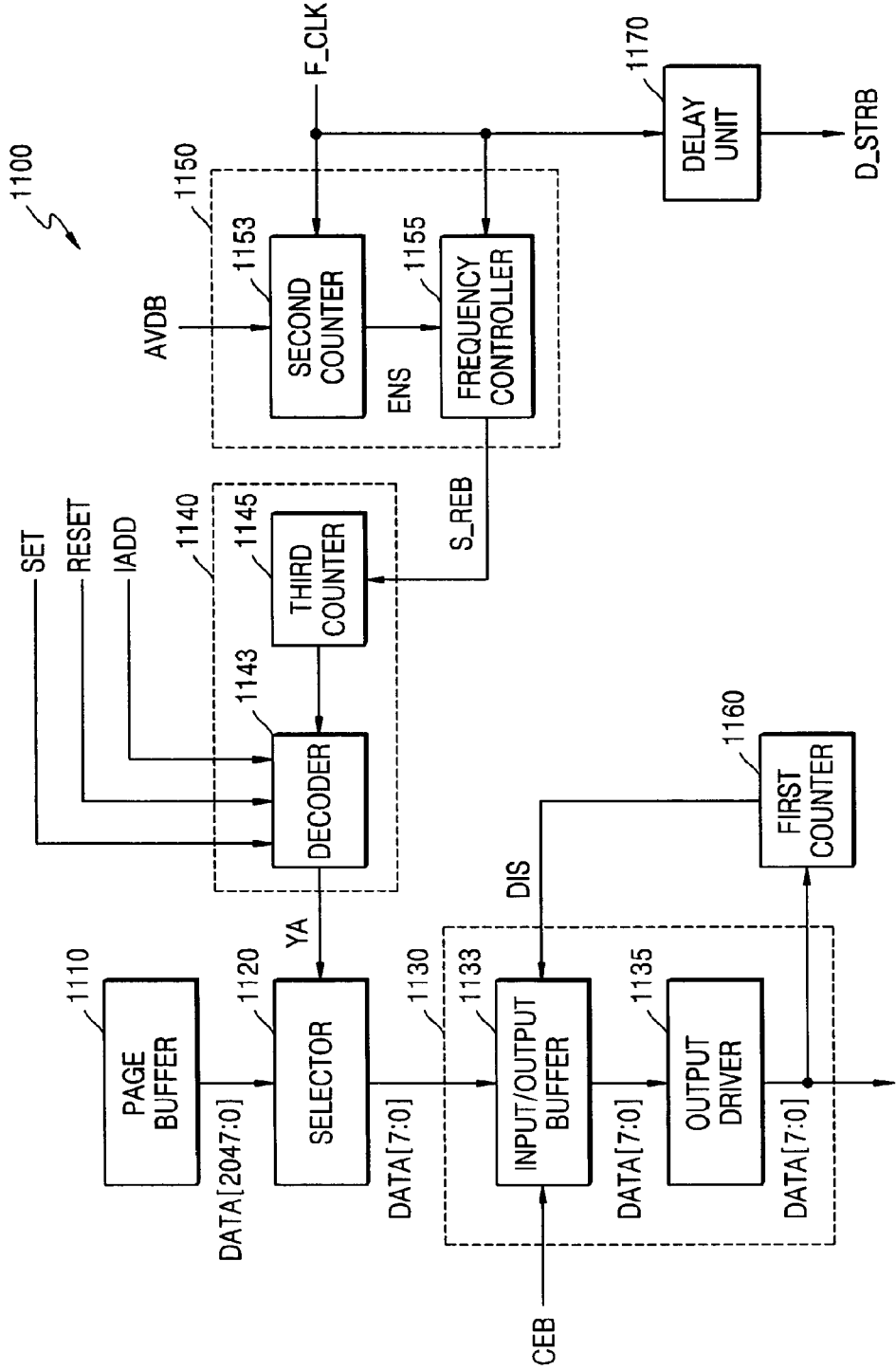
FIG. 11 is a block diagram of a non-volatile memory device according to some embodiments of the present invention.

FIG. 11 is a block diagram of a non-volatile memory device in accordance with some embodiments of the present invention. Data output method embodiments 800 will be described in more detail in connection with a non-volatile memory device of FIG. 11. Referring now to FIG. 11, a non-volatile memory device 1100 comprises a page buffer 1110, a selector 1120, an output unit 1130, a first counter 1160, an address signal generator 1140, and a data read controller 1150.

The page buffer 1110 receives and stores a portion of data stored in a non-volatile memory array (not shown). The selector 1120 outputs data corresponding to an address value of an address signal YA among data DATA[2047:0] stored in the page buffer 110.

The output unit 1130 is activated in response to an enable signal CEB, outputs data DATA[7:0] received from the selector 1120 through an input/output pin, and is deactivated in response to a disable signal DIS. The output unit 1130 includes an input/output buffer 1133 and an output driver 1135.

The first counter 1160 generates a disable signal DIS if the number of the output data DATA[7:0] is m. The address signal generator 1140 decodes an initial address IADD, generates an address signal YA, and changes the address value of the address signal YA in response to a sub flash clock signal S_REB.

The data read controller 1150 receives a read recognition signal AVDB and a flash clock signal F_CLK and generates a sub flash clock signal S_REB with a frequency double that of the flash clock signal F_CLK if the number of the first edges of the flash clock signal F_CLK is n (n is a natural number).

The structures and operations of the page buffer 1110, the selector 1120, the output unit 1130, and the address generator 140 are the same as the respective corresponding components of the non-volatile memory device 500 of FIG. 5. Therefore, detailed descriptions thereof are omitted.

Referring to FIGS. 8 through 11, data output methods and operations of non-volatile memory devices, according to some embodiments of the present invention, will now be described.

If a read recognition signal AVDB is activated, the number of first edges of a flash clock signal F_CLK is counted. As shown in FIG. 10a, the read recognition signal AVDB is activated at a low level. The read recognition signal AVDB may be activated at a high level in accordance with other embodiments of the present invention. The non-volatile memory device 1100 of FIG. 11 counts the number of first edges of the flash clock signal F_CLK after the read recognition signal AVDB is activated, and outputs data when the counted number of first edges reaches a predetermined number.

The predetermined number is n and n is a natural number. For convenience of description, it is assumed that n is 3. The operation of counting the first edges of the flash clock signal F_CLK is performed by a second counter 1153 of the data read controller 1150. The second counter 1153 counts the first edges of the flash clock signal F_CLK from the time when the read recognition signal AVDB is activated. The second counter 1153 outputs an activation signal ENS for operating the frequency controller 1155 when the number of the first edges of the flash clock signal F_CLK reaches n.

The second counter 1153 and the frequency controller 1155 receive the flash clock signal F_CLK at the same time, but, the second counter 1153 first operates in response to the read recognition signal AVDB and the frequency controller 1155 operates after receiving the activation signal ENS.

If the frequency controller 1155 receives the activation signal ENS, the frequency controller 1155 doubles the frequency of the flash clock signal F-CLK and generates a sub flash clock signal S-REB. A waveform of the sub flash clock signal S-REB is shown in FIG. 10b. Because the frequency of the flash clock signal F-CLK is doubled, a period of the sub flash clock signal S_REB becomes half of that of the read control signal REB.

As shown in FIG. 10b, the sub-flash clock signal S-REB has rising edges in synchronization to every rising and falling edge of the flash clock signal F_CLK. A third counter 1145 of the address signal generator 1140 counts the rising edges of the sub flash clock signal S-REB and increases the address value of the address signal YA.

Increasing the address value of the address signal YA per every rising edge of the sub flash clock signal S_REB is the same as increasing the address value of the address signal YA per every rising and falling edge of the flash clock signal F_CLK. The operation of increasing the address value of the address signal YA to output data is described above and therefore detailed descriptions thereof are omitted.

It is then determined whether the number of the output data DATA[7:0] is m. If the number of the output data DATA[7:0] is m, then the output of the data DATA[7:0] is stopped (block 840). The operations of block 840 are performed by the first counter 1160. Here, m is a natural number.

If the number of the output data DATA[7:0] is m, then the first counter 1160 applies a disable signal DIS to the input/output buffer 1133 of the output unit 1130. Thus, the operation of the input/output buffer 1133 is stopped and the output of the data DATA[7:0] is also stopped.

Data output method embodiments 800 of FIG. 8, in accordance with further embodiments of the present invention, comprise generating a data strobe signal D_STRB, which is created by delaying the flash clock signal F_CLK by a predetermined time and output at the same time with the data DATA[7:0] to an external source.

The data strobe signal D_STRB may be generated by a delay unit 1170 of the non-volatile memory device 1100. The data DATA[7:0] output from the non-volatile memory device 1100 is applied to an external controller (not shown). When the data DATA[7:0] is transmitted from the non-volatile memory device 1100 to the external controller (not shown), a time difference exists due to the flight time and clock skew Also, as the operation speed of the non-volatile memory device 1100 becomes faster, deciding a time when the controller fetches the data DATA[7:0] output from the non-volatile memory device 1100 may become more difficult. To solve such a problem, the non-volatile memory device 1100 outputs a data strobe signal D_STRB for indicating the time when the controller fetches the data DATA[7:0] concurrently with the data DATA[7:0].

FIG. 12 is a timing diagram that illustrates operations of the controller according to some embodiments of the present invention. Referring now to FIG. 12, the data strobe signal D-STRB is output at the same time when data is output through the input/output pin in response to the rising and falling edges of the flash clock signal F_CLK. The data strobe signal D_STRB is a signal that is created by delaying the flash clock signal F_CLK by a predetermined time. A delay time tD1 is a time period from a time when the flash clock signal F_CLK is input to the non-volatile memory device 1100 to a time when the data DATA[7:0] is output from the non-volatile memory device 1100.

The delay unit 1170 operates in the same manner as the delay unit 560 of FIG. 5; therefore, detailed descriptions thereof are omitted. D_STRB_CTRL represents the data strobe signal D_STRB transmitted from the non-volatile memory device 1100 to the controller (not shown). tD2 represents a propagation delay time from the non-volatile memory device 1100 to the controller (not shown). An input/output pin IOP_CTRL of the controller fetches data in response to the data strobe signal D_STRB_CTRL when the data strobe signal D_STRB_CTRL reaches the controller.

As described above, according to data output method embodiments and the non-volatile memory device embodiments of the present invention, by outputting data in response to all of the rising and falling edges of a read control signal, it is possible to increase the amount of data transmission per unit of time.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of performing a read operation in a non-volatile memory device, the method comprising:
receiving a read control signal at a terminal of the memory device, the read control signal comprising an alternating sequence of first and second edges, the read control signal controlling an access time when a sequential data output operation is enabled in the non-volatile memory device, the first edges being one of rising edges and falling edges of the read control signal and the second edges being the other of rising and falling edges of the read control signal;
generating a data strobe signal by delaying the read control signal, the data strobe signal comprising an alternating sequence of third and fourth edges, the third edges being one of rising edges and falling edges of the data strobe signal and the fourth edges being the other of rising and falling edges of the data strobe signal;
sequentially outputting first and second data in response to one of the first edges and one of the second edges of the read control signal, respectively; and
outputting the data strobe signal concurrently with outputting the first and second data,
wherein the output of the first data is aligned with one of the third edges of the data strobe signal,
wherein the output of the second data is aligned with one of the fourth edges of the data strobe signal, and
wherein the alternating sequence of first and second edges of the read control signal is received only during the data output operation of the non-volatile memory.

2. The method of claim 1, wherein the generating of the data strobe signal comprises delaying the read control signal by a predetermined period of time.

3. The method of claim 1,
wherein the read control signal comprises a first portion where the read control signal regularly alternates between a first logic level and a second logic level.
wherein the generating of the data strobe signal comprises delaying the read control signal by a delay time,
wherein the delay time is substantially the same as a time period from a time when the second logic level of the read control signal is first input to the non-volatile memory device during the data output operation to the time when the data is first output from the non-volatile memory device during the data output operation.

4. The method of claim 1,
wherein the generating of the data strobe signal comprises delaying the read control signal by a delay time,
wherein the delay time is adjustable by using a register of the non-volatile memory device.

5. The method of claim 1, further comprising:
receiving a first portion of the read control signal, the first portion of the read control signal regularly alternating between a first logic level and a second logic level at a first frequency;
generating a sub-read control signal in response to the read control signal, the sub-read control signal being generated with a second frequency, the second frequency being double the first frequency;
increasing an address value at each period of the sub-read control signal; and
outputting data corresponding to the increased address value.

6. The method of claim 5, further comprising:
receiving a second portion of the read control signal immediately prior in time to receiving the first portion of the read control signal, the second portion of the read control signal comprising the first logic level sustained for a time at least as long as a period of the first portion of the read control signal.

7. The method of claim 1, further comprising:
receiving a first portion of the read control signal, the first portion of the read control signal regularly alternating between a first logic level and a second logic level at a first frequency; and
receiving a second portion of the read control signal immediately prior in time to receiving the first portion of the read control signal, the second portion of the read control signal comprising the first logic level sustained for a time at least as long as a period of the first portion of the read control signal,
wherein a transition from the second portion of the read control signal to the first portion of the read control signal initiates the sequential data output.

8. A method of performing a read operation in a memory system comprising a controller and a non-volatile memory device, the method comprising:
applying a read control signal from the controller to the non-volatile memory device, the read control signal comprising an alternating sequence of first and second edges, the first edges being one of rising edges and falling edges of the read control signal and the second edges being the other of rising and falling edges of the read control signal, the read control signal controlling an access time when a sequential data output operation is enabled in the non-volatile memory device;
in the non-volatile memory device, generating a first address value in response to one of the first edges of the read control signal and generating a second address value in response to one of the second edges of the read control signal;
selecting first and second data of the non-volatile memory device in response to the first and second address values, respectively;
generating a data strobe signal by delaying the read control signal for a first delay time in the non-volatile memory device, the data strobe signal comprising an alternating sequence of third and fourth edges, the third edges being one of rising edges and falling edges of the data strobe signal and the fourth edges being the other of rising and falling edges of the data strobe signal;
from the non-volatile memory, outputting the data strobe signal concurrently with outputting first and second data, wherein output of the first data is aligned with one of the third edges of the data strobe signal and output of the second data is aligned with one of the fourth edges of the data strobe signal; and
in the controller, fetching the first and second data output by the non-volatile memory in response to the data strobe signal.

9. The method of claim 8, wherein the alternating sequence of first and second edges of the read control signal is applied only during the data output operation of the non-volatile memory.

10. The method of claim 8, wherein the generating of the data strobe signal comprises delaying the read control signal by a predetermined period of time.

11. The method of claim 8,
wherein the read control signal comprises a first portion where the read control signal regularly alternates between a first logic level and a second logic level,
wherein the generating of the data strobe signal comprises delaying the read control signal by a delay time, wherein the first period of time is substantially the same as a time period from a time when the second logic level of the read control signal is first input to the non-volatile memory device during the data output operation to the time when the data is first output from the non-volatile memory device during the data output operation.

12. The method of claim 8, wherein the first period of time is adjustable by using a register of the non-volatile memory device.

13. The method of claim 8, wherein the fetching of the data comprises:
receiving the data strobe signal with a delay in the controller;
receiving the data output from the non-volatile memory device in the controller; and
fetching the data in response to the received data strobe signal in the controller.

14. The method of claim 8, further comprising:
applying a first portion of the read control signal from the controller to the non-volatile memory device, the first portion of the read control signal regularly alternating between a first logic level and a second logic level at a first frequency;
generating a sub-read control signal in response to the read control signal, the sub-read control signal being generated with a second frequency, the second frequency being double the first frequency; and
increasing a corresponding address value at each period of the sub read control signal.

15. The method of claim 14, wherein the outputting of the data comprises: outputting, from the non-volatile memory device to the controller, data corresponding to the increased address value concurrently with outputting the data strobe signal.

16. The method of claim 15, further comprising:
applying a second portion of the read control signal from the controller to the non-volatile memory device immediately prior in time to applying the first portion of the read control signal, the second portion of the read control signal comprising the first logic level sustained for a time at least as long as a period of the first portion of the read control signal.

17. The method of claim 8, further comprising:
applying a first portion of the read control signal from the controller to the non-volatile memory device, the first portion of the read control signal regularly alternating between a first logic level and a second logic level at a first frequency;
applying a second portion of the read control signal from the controller to the non-volatile memory device immediately prior in time to applying the first portion of the read control signal, the second portion of the read control signal comprising the first logic level sustained for a time at least as long as a period of the first portion of the read control signal,
wherein a transition from the second portion of the read control signal to the first portion of the read control signal initiates the sequential data output from the non-volatile memory.

18. A non-volatile memory device comprising:
a page buffer that is configured to receive data from a non-volatile memory array;
a selector that is configured to sequentially output portions of the data stored in the page buffer corresponding to respective address values of an address signal;
an output unit configured to sequentially receive the portions of the data output by the selector;
an address signal generator that is configured to change the address value of the address signal in response to a read control signal comprising an alternating sequence of first and second edges, the first edges being one of rising edges and falling edges of the read control signal and the second edges being the other of rising and falling edges of the read control signal, the read control signal controlling an access time when a sequential data output operation is enabled; and
a delay unit that is configured to generate and output a data strobe signal in response to the read control signal,
wherein the output unit is configured to output the portions of data transmitted from the selector aligned with and in synchronization with respective sequential edges of the data strobe signal.

19. The non-volatile memory device of claim 18, wherein the data strobe signal is generated by delaying the read control signal by a predetermined delay time.

20. The non-volatile memory device of claim 18,
wherein the read control signal comprises a first portion where the read control signal regularly alternates between a first logic level and a second logic level, and
wherein the delay unit is configured to generate the data strobe signal by delaying the read control signal by a delay time substantially the same as a time period from a time when the second logic level of the read control signal is first input to the non-volatile memory device during the data output operation to the time when the data is first output from the non-volatile memory device during the data output operation.

21. The non-volatile memory device of claim 18,
wherein the delay unit is configured to generate the data strobe signal by delaying the read control signal by a delay time,
wherein the non-volatile memory device further comprises a register to adjust the delay time.

22. The non-volatile memory device of claim 18, further comprising:
a frequency controller that is configured to generate, in response to the read control signal, a sub-read control signal having a frequency double the frequency of the read control signal.

23. The non-volatile memory device of claim 22, wherein the address signal generator is configured to increase an address value of the address signal sequentially every period of the sub-read control signal.

24. The non-volatile memory device of claim 18, further comprising:
a read controller that is configured to generate a disable signal to disable data output of the output unit in response to the read control signal.

25. The non-volatile memory device of claim 24, wherein the output unit is configured to disable output of the portions of data if the read control signal and a second control signal received by the nonvolatile memory device have edges that are synchronized.

26. The non-volatile memory device of claim 25, wherein the second control signal is a write enable signal.

27. The non-volatile memory device of claim 24, wherein the read controller is configured to generate the disable signal in response to the read control signal transitioning between a first logic level and a second logic level.

28. The non-volatile memory device of claim 18,
wherein the read control signal comprises a first portion of the read control signal regularly alternating between a first logic level and a second logic level and a second portion, immediately prior in time to the first portion of the read control signal, the second portion of the read control signal comprising the first logic level sustained for a time at least as long as a period of the first portion of the read control signal, wherein the output unit is configured to be responsive to a transition from the second portion of the read control signal to the first portion of the read control signal to thereby initiate the sequential data output from the non-volatile memory.

\* \* \* \* \*